(12) United States Patent
Nagai et al.

(10) Patent No.: US 12,315,757 B2
(45) Date of Patent: May 27, 2025

(54) STACKED STRUCTURE AND SEMICONDUCTOR MANUFACTURING APPARATUS MEMBER

(71) Applicant: NGK INSULATORS, LTD., Nagoya (JP)

(72) Inventors: Asumi Nagai, Okazaki (JP); Noboru Nishimura, Nagoya (JP); Hirofumi Yamaguchi, Komaki (JP)

(73) Assignee: NGK INSULATORS, LTD., Nagoya (JP)

( * ) Notice: Subject to any disclaimer, the term of this patent is extended or adjusted under 35 U.S.C. 154(b) by 146 days.

(21) Appl. No.: 17/201,355

(22) Filed: Mar. 15, 2021

(65) Prior Publication Data

US 2021/0305083 A1 Sep. 30, 2021

(30) Foreign Application Priority Data

Mar. 27, 2020 (JP) .................... 2020-058647

(51) Int. Cl.
*H01L 21/67* (2006.01)
*B32B 18/00* (2006.01)
*H01L 21/687* (2006.01)

(52) U.S. Cl.
CPC ........ *H01L 21/68757* (2013.01); *B32B 18/00* (2013.01); *H01L 21/67103* (2013.01); *B32B 2307/302* (2013.01)

(58) Field of Classification Search
CPC .............. B32B 18/00; B32B 2307/302; C04B 2235/3206; C04B 2235/3217; C04B 2235/3222; C04B 2235/3225; C04B 2235/3244; C04B 2235/3865; C04B 2235/3869; C04B 2235/3886; C04B 2235/401; C04B 2235/402; C04B 2235/5409; C04B 2235/5445; C04B 2235/6565; C04B 2235/6567;
(Continued)

(56) References Cited

U.S. PATENT DOCUMENTS 4,517,037 A * 5/1985 Francis ............ C04B 35/58028
156/89.27
6,261,708 B1 7/2001 Ohashi et al.
(Continued)

FOREIGN PATENT DOCUMENTS

JP 3604888 B2 12/2004
JP 4311910 B2 8/2009
(Continued)

OTHER PUBLICATIONS

Taiwanese Office Action dated Feb. 2, 2023 (Application No. 110109535).
(Continued)

*Primary Examiner* — Sang Y Paik
(74) *Attorney, Agent, or Firm* — BURR PATENT LAW, PLLC

(57) ABSTRACT

A stacked structure includes a first structure formed of a composite sintered body that contains AlN and $MgAl_2O_4$ as main phases, and a second structure formed of a ceramic sintered body and stacked on and bonded to the first structure. A difference in linear thermal expansion coefficient between the first structure and the second structure is less than or equal to 0.3 ppm/K.

7 Claims, 1 Drawing Sheet

(58) Field of Classification Search
CPC .......... C04B 2235/761; C04B 2235/77; C04B 2235/80; C04B 2235/9607; C04B 2237/343; C04B 2237/366; C04B 2237/368; C04B 35/443; C04B 35/581; C04B 35/597; C04B 35/645; C04B 37/001; C04B 37/006; H01L 21/67103; H01L 21/68757
USPC ...................................................... 219/444.1
See application file for complete search history.

(56) References Cited

U.S. PATENT DOCUMENTS

| | | |
|---|---|---|
| 2005/0160989 A1 | 7/2005 | Kuibira et al. |
| 2005/0211691 A1* | 9/2005 | Unno ................ H01L 21/67103 |
| | | 219/216 |
| 2012/0231243 A1 | 9/2012 | Watanabe et al. |
| 2013/0220988 A1* | 8/2013 | Kondo ................. C04B 35/581 |
| | | 219/444.1 |
| 2014/0290863 A1* | 10/2014 | Watanabe ............... C04B 35/58 |
| | | 156/345.52 |
| 2014/0318575 A1* | 10/2014 | Parkhe .............. H01J 37/32862 |
| | | 279/157 |
| 2015/0284293 A1* | 10/2015 | Harmuth ............. C04B 35/0435 |
| | | 501/98.5 |
| 2017/0127475 A1 | 5/2017 | Nagai et al. |
| 2019/0136372 A1* | 5/2019 | Zhan ................... H01L 21/6875 |
| 2019/0292105 A1 | 9/2019 | Yagi et al. |
| 2022/0181126 A1* | 6/2022 | Hollingsworth .... C23C 16/4586 |

FOREIGN PATENT DOCUMENTS

| | | |
|---|---|---|
| JP | 2019-167288 A1 | 10/2019 |
| TW | 201731013 A | 9/2017 |
| TW | 202003423 A | 1/2020 |

OTHER PUBLICATIONS

Chinese Office Action dated Jun. 1, 2023 (Application No. 202110228008.3).

* cited by examiner

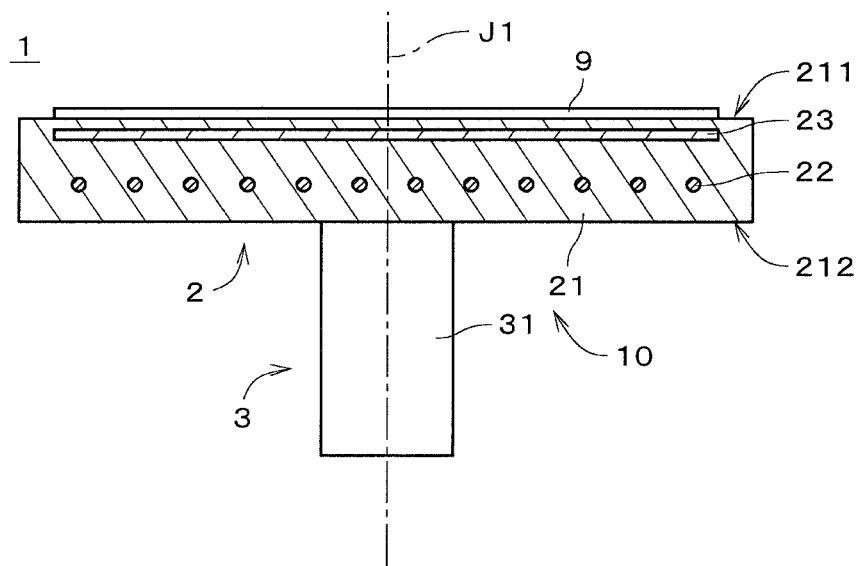

STACKED STRUCTURE AND SEMICONDUCTOR MANUFACTURING APPARATUS MEMBER

TECHNICAL FIELD

The present invention relates to a stacked structure and a semiconductor manufacturing apparatus member including the stacked structure.

CROSS-REFERENCE TO RELATED APPLICATION

This application claims priority benefit under 35 U.S.C. Section 119 of Japanese Patent Application No. 2020-058647 filed in the Japan Patent Office on Mar. 27, 2020, the entire disclosure of which is incorporated herein by reference.

BACKGROUND ART

Heaters made of ceramic and for holding and heating a semiconductor substrate have conventionally been used in semiconductor-substrate manufacturing apparatuses. For example, Japanese Patent No. 4311910 (Document 1) discloses a shaft-equipped heater that includes a disk-like wafer holder made of aluminum nitride (AlN) and a cylindrical support made of AlN or mullite and bonded to the lower face of the wafer holder. Japanese Patent No. 3604888 (Document 2) adopts solid-liquid bonding as a method of bonding a susceptor of AlN ceramic and a support. Japanese Patent Application Laid-Open No. 2019-167288 (Document 3) discloses a composite sintered body of AlN and magnesium-aluminum spinel ($MgAl_2O_4$) as a susceptor material having higher plasma corrosion resistance and higher volume resistivity than AlN in a high-temperature environment.

The composite sintered body of AlN and $MgAl_2O_4$ as in Document 3 has a higher thermal expansion coefficient than the AlN sintered body serving as the material for the support in Document 1. A difference in thermal expansion coefficient between the composite sintered body and the AlN sintered body is in the range of 1.0 ppm/K to 2.5 ppm/K and relatively large. Thus, repeated heating and cooling of a stacked structure configured by bonding a support formed of the AlN sintered body to a susceptor formed of the composite sintered body may produce thermal stress at the junction due to the difference in the amount of thermal expansion and shrinkage and accordingly may cause damage such as cracks at the junction.

SUMMARY OF INVENTION

It is an object of the present invention to lessen damage to a junction resulting from thermal stress in a stacked structure A stacked structure according to a preferable embodiment of the present invention includes a first structure formed of a composite sintered body that contains AlN and $MgAl_2O_4$ as main phases, and a second structure formed of a ceramic sintered body and stacked on and bonded to the first structure. A difference in linear thermal expansion coefficient between the first structure and the second structure is less than or equal to 0.3 ppm/K.

According to the present invention, it is possible to lessen damage to the junction resulting from thermal stress.

Preferably, the composite sintered body of the first structure contains 15% or more and 70% or less by mass of $MgAl_2O_4$.

Preferably, the ceramic sintered body of the second structure contains AlON.

Preferably, the ceramic sintered body of the second structure further contains SiAlON.

Preferably, the composite sintered body of the first structure has volume resistivity higher than or equal to $7.0 \times 10^7$ Ω·cm at 700° C.

Preferably, the composite sintered body of the first structure has thermal conductivity higher than or equal to 15 W/(m·K) at ambient temperature.

Preferably, thermal conductivity of the ceramic sintered body of the second structure at ambient temperature is lower by 10 W/(m·K) or more than thermal conductivity of the composite sintered body of the first structure at ambient temperature.

The present invention is also intended for a semiconductor manufacturing apparatus member used in a semiconductor manufacturing apparatus. A semiconductor manufacturing apparatus member according to a preferable embodiment of the present invention includes the stacked structure described above.

Preferably, the semiconductor manufacturing apparatus member includes a substrate heating part that includes the first structure of the stacked structure and supports and heats a substrate, and a supporter that includes the second structure of the stacked structure and is bonded to the substrate heating part to support the substrate heating part These and other objects, features, aspects and advantages of the present invention will become more apparent from the following detailed description of the present invention when taken in conjunction with the accompanying drawings.

BRIEF DESCRIPTION OF DRAWINGS

FIG. 1 is a sectional view of a heater according to one embodiment.

DESCRIPTION OF EMBODIMENTS

FIG. 1 is a sectional view of a heater 1 according to one embodiment of the present invention. The heater 1 is one of semiconductor manufacturing apparatus members used in a semiconductor manufacturing apparatus, and is also referred to as a shaft-equipped heater. The heater 1 holds and heats a generally disk-like semiconductor substrate 9 (hereinafter, simply referred to as a "substrate 9") from the underside in FIG. 1. In the following description, the upper side and the lower side in FIG. 1 are simply referred to as the "upper side" and the "lower side", respectively. The up-down direction in FIG. 1 is also simply referred to as the "up-down direction." The up-down direction in FIG. 1 does not necessarily have to match the actual up-down direction when the heater 1 is installed in a semiconductor manufacturing apparatus.

The heater 1 includes a substrate heating part 2 and a supporter 3. The substrate heating part 2 is a generally disk-like member centered on a central axis J1 extending in the up-down direction, and is also referred to as a "heater plate." The substrate heating part 2 supports and heats the substrate 9 from the underside. The supporter 3 is a generally cylinder-like or column-like member centered on the central axis J1, and is also referred to as a "shaft." In the example illustrated in FIG. 1, the supporter 3 has a smaller diameter than the substrate heating part 2 in plan view. The supporter 3 is bonded to the central portion of the lower face of the substrate heating part 2 and supports the substrate heating part 2 from the underside.

The substrate heating part 2 includes a heating-part body 21, a resistance heating element 22, and an internal electrode 23. The heating-part body 21 is a generally disk-like member formed of a composite sintered body, which will be described later. The substrate 9 is placed on an upper face 211 of the heating-part body 21. The resistance heating element 22 and the internal electrode 23 are arranged (buried) inside the heating-part body 21. Inside the heating-part body 21, the resistance heating element 22 is arranged between the internal electrode 23 and a lower face 212 of the heating-part body 21. In other words, the internal electrode 23 is arranged between the resistance heating element 22 and the upper face 211 of the heating-part body 21.

The resistance heating element 22 is formed of, for example, a metal wire that is wound into a coil. When viewed in plan view, the resistance heating element 22 is a continuous member that is wired in a generally concentric pattern across almost the entire heating-part body 21. In the semiconductor manufacturing apparatus, the supply of power from a power supply source (not shown) to the resistance heating element 22 causes the resistance heating element 22 to generate heat and causes the heating-part body 21 to rise in temperature. Accordingly, the substrate 9 placed on the upper face 211 of the heating-part body 21 is heated to a predetermined temperature. The resistance heating element 22 is a heater electrode for heating the substrate 9.

The internal electrode 23 is, for example, a generally disk-like member made of metal. For example, the internal electrode 23 is an RF electrode (i.e., high-frequency electrode) for plasma treatment. In the semiconductor manufacturing apparatus, high-frequency power is supplied from a high-frequency power supply source (not shown) to the internal electrode 23. This excites a processing gas and produces plasma in a processing space between the heater 1 and an upper electrode arranged above the heater 1. Then, the plasma is used to subject the substrate 9 to plasma treatment such as film deposition and etching.

The resistance heating element 22 and the internal electrode 23 are preferably formed of a metal with a relatively high melting point and carbide or nitride of the metal. Examples of the metal include tantalum (Ta), tungsten (W), molybdenum (Mo), platinum (Pt), rhenium (Re), hafnium (Hf), and an alloy of these metals. The resistance heating element 22 and the internal electrode 23 may also contain oxide ceramic such as $Al_2O_3$ or $ZrO_2$ as a filler component.

The supporter 3 includes a supporter body 31. The supporter body 31 is a generally cylinder-like or column-like member formed of a ceramic sintered body, which will be described later. In the example illustrated in FIG. 1, the supporter 3 has a generally cylindrical shape and includes electric wires or other components for supplying power to the resistance heating element 22 and the internal electrode 23 of the substrate heating part 2. The supporter body 31 is stacked on and bonded to the heating-part body 21 of the substrate heating part 2 in the up-down direction on the underside of the heating-part body 21. Specifically, the upper end of the supporter body 31 is bonded to the central portion of the lower face 212 of the heating-part body 21. In the following description, the heating-part body 21 and the supporter body 31 are respectively referred to as a "first structure" and a "second structure." The heating-part body 21 and the supporter body 31 stacked on and bonded to each other are also collectively referred to as a "stacked structure 10."

The heating-part body 21 of the substrate heating part 2 is formed of a composite sintered body that contains aluminum nitride (AlN) and magnesium-aluminum spinel ($MgAl_2O_4$) as main phases (also referred to as "main constituent phases"). The content of the aforementioned main phases (i.e., the total content of AlN and $MgAl_2O_4$) in the composite sintered body is 95% or more and 100% or less by mass, and preferably 98% or more and 100% or less by mass. The $MgAl_2O_4$ content in the composite sintered body is 15% or more and 70% or less by mass, preferably 20% or more and 65% or less by mass, and more preferably 25% or more and 60% or less by mass. The AlN content in the composite sintered body is 30% or more and 85% or less by mass, preferably 35% or more and 80% or less by mass, and more preferably 45% or more and 75% or less by mass. This achieves a high-density composite sintered body having high plasma corrosion resistance, high volume resistivity, and high thermal conductivity.

Preferably, $MgAl_2O_4$ contained in the composite sintered body has a lattice constant higher than or equal to 8.075 angstroms. In the composite sintered body, preferably, magnesium (Mg) is dissolved in a solid state in AlN. Preferably, the composite sintered body substantially does not contain a magnesium oxide (MgO) crystalline phase. In other words, it is preferable that the content of the MgO crystalline phase in the composite sintered body is substantially 0% by mass.

The composite sintered body preferably has an open porosity less than 0.1%, and more preferably less than 0.05%. There are no particular limitations on a lower limit of the open porosity, and the open porosity is preferably as low as possible. The composite sintered body preferably has volume resistivity higher than or equal to $2.0 \times 10^{14}$ $\Omega \cdot cm$ and more preferably higher than or equal to $2.0 \times 10^{15}$ $\Omega \cdot cm$ at ambient temperature (i.e., 25° C.). The volume resistivity of the composite sintered body at 700° C. is preferably higher than or equal to $7.0 \times 10^7$ $\Omega \cdot cm$ and more preferably higher than or equal to $7.0 \times 10^8$ $\Omega \cdot cm$. There are no particular limitations on an upper limit of the volume resistivity, and the volume resistivity is preferably as high as possible.

The linear thermal expansion coefficient of the composite sintered body in a temperature range from ambient temperature to 1000° C. is preferably higher than or equal to 6.8 ppm/K (i.e., 6.8 ppm/° C.) and lower than or equal to 7.4 ppm/K. Unless otherwise specified, the "linear thermal expansion coefficient" in the following description refers to the linear thermal expansion coefficient in the temperature range from ambient temperature to 1000° C. Unless otherwise specified, the "thermal conductivity" refers to the thermal conductivity at ambient temperature (i.e., 25° C.).

Next is a description of the method of manufacturing the above-described composite sintered body, which configures the heating-part body 21 serving as the aforementioned first structure. In the manufacture of the composite sintered body, first, AlN and additives are mixed to obtain mixed powder. The additives include magnesium (Mg) and aluminum (Al). Then, the mixed powder is molded into a green body of a predetermined shape. For example, AlN powder and powder of additives are subjected to wet mixing in an organic solvent to obtain slurry. Then, the slurry is dried into mixed powder (i.e., blended powder), and the mixed powder is molded into the aforementioned green body. The AlN powder and the powder of additives may be mixed by dry mixing, instead of wet mixing.

The mixed powder is charged into a hot press die so as to be molded into a green body of a predetermined shape (e.g., a generally disk shape). Alternatively, the mixed powder may be subjected to uniaxial pressure molding so as to be molded into a green body of a predetermined shape. The molding of the green body may be conducted by any of other various methods that enable maintaining the shape. As another alternative, the mixed powder processed into a flowable state, such as the aforementioned slurry, may be poured as-is into a mold and made into a green body of a predetermined shape by removing solvent components.

The total content of AlN and the additives in the aforementioned mixed powder is in the range of 95% to 100% by mass. The additives may include, for example, MgO and $Al_2O_3$. The additives may also include $MgAl_2O_4$, MgO, and $Al_2O_3$.

The green body obtained as described above is subjected to hot press firing so as to generate the above-described composite sintered body of a generally disk-like shape containing AlN and $MgAl_2O_4$. Specifically, the green body is placed in a hot press die (e.g., carbon jig) and heated and pressed to obtain the composite sintered body. The firing of the green body is conducted in, for example, a vacuum atmosphere or a non-oxidizing atmosphere. The heating temperature, the press pressure, and the firing time during the hot press firing may be appropriately determined. A maximum heating temperature during the hot press firing is preferably in the range of 1650° C. to 1800° C.

In the aforementioned hot press firing, high sealing performance of the hot press die suppresses reduction of MgO in $MgAl_2O_4$ and subsequent generation of Mg. This suppresses generation of pores in the composite sintered body resulting from volatilization of reduced Mg (at a boiling point of 1091° C.). As a result, a high-density composite sintered body (i.e., dense composite sintered body) can be obtained.

In the case where the aforementioned additives include $MgAl_2O_4$ and MgO and do not include $Al_2O_3$, MgO in the additives and $Al_2O_3$ that is contained inevitably as impurities in the AlN powder (i.e., an oxide film or the like generated on the surface of the AlN powder; hereinafter also referred to as "$Al_2O_3$ impurities") react with each other and produce $MgAl_2O_4$ in the above-described hot press firing. Accordingly, it is preferable that the amount of the substance MgO in the additives is approximately the same as the amount of the substance $Al_2O_3$ contained as impurities in the AlN powder. If the amount of the substance MgO in the additives is greater than the amount of the substance $Al_2O_3$ impurities, MgO that has not reacted with the $Al_2O_3$ impurities remains in the composite sintered body produced by the hot press firing.

In the case where the additives include MgO and $Al_2O_3$ and do not include $MgAl_2O_4$, MgO and $Al_2O_3$ in the additives and $Al_2O_3$ impurities in AlN react with one another and produce $MgAl_2O_4$ in the above-described hot press firing. Accordingly, it is preferable that the amount of the substance MgO in the additives is approximately the same as a total of the amount of the substance $Al_2O_3$ in the additives and the amount of the substance $Al_2O_3$ impurities. If the amount of the substance MgO in the additives is greater than the total of the amount of the substance $Al_2O_3$ and the amount of the substance $Al_2O_3$ impurities, MgO that has not reacted with $Al_2O_3$ remains in the composite sintered body produced by the hot press firing. The same applies to the case where the additives include $MgAl_2O_4$, MgO, and $Al_2O_3$.

The substrate heating part 2 is formed by, for example, stacking and bonding two generally disk-like composite sintered bodies manufactured by the above-described manufacturing method, with the resistance heating element 22 and the internal electrode 23 sandwiched therebetween. In this case, the heating-part body 21 corresponds to these two composite sintered bodies. Alternatively, the resistance heating element 22 and the internal electrode 23 may be produced inside the heating-part body 21 by embedding a metal material into the aforementioned green body during molding of the green body and firing the metal material together with the green body. In the manufacture of the substrate heating part 2, the resistance heating element 22 and the internal electrode 23 may be generated and placed by any of various methods. The aforementioned firing of the green body may be conducted by a method other than hot press firing.

The supporter body 31 of the supporter 3 is formed of a ceramic sintered body as described above. The ceramic sintered body may be formed of various selected materials. The ceramic sintered body preferably has an open porosity less than 0.1%, and more preferably less than 0.05%. There are no particular limitations on a lower limit of the open porosity, and the open porosity is preferably as low as possible. The linear thermal expansion coefficient of the ceramic sintered body (i.e., the linear thermal expansion coefficient in the temperature range from ambient temperature to 1000° C.) is higher than or equal to 6.8 ppm/K and lower than or equal to 7.4 ppm/K. In the temperature range from ambient temperature to 1000° C., a difference in linear thermal expansion coefficient between the ceramic sintered body and the composite sintered body is less than or equal to 0.3 ppm/K. The ceramic sintered body and the composite sintered body, which configures the heating-part body 21, may have the same linear thermal expansion coefficient, or one of them may have a higher linear thermal expansion coefficient than the other.

The following is a description of four examples of the composition of the ceramic sintered body that configures the supporter body 31. In the first example, the ceramic sintered body contains AlN and $MgAl_2O_4$ as constituent phases. The total content of AlN and $MgAl_2O_4$ in the ceramic sintered body in the first example is, for example, 95% or more and 99.5% or less by mass. The $MgAl_2O_4$ content in the ceramic sintered body is 35% or more and 55% or less by mass, and the AlN content is 45% or more and 65% or less by mass. The thermal conductivity of the ceramic sintered body (i.e., the thermal conductivity at ambient temperature) is higher than or equal to 35 W/(m·K) and lower than or equal to 45 W/(m·K). The linear thermal expansion coefficient of the ceramic sintered body is higher than or equal to 6.8 ppm/K and lower than or equal to 7.4 ppm/K and different by 0.3 ppm/K or less from the linear thermal expansion coefficient of the composite sintered body, which configures the heating-part body 21.

In the second example, the ceramic sintered body contains AlN and aluminum yttrium oxide ($Al_5Y_3O_{12}$) as constituent phases. The total content of AlN and $Al_5Y_3O_{12}$ in the ceramic sintered body in the second example is, for example, 95% or more and 99% or less by mass. The $Al_5Y_3O_{12}$ content in the ceramic sintered body is 50% or more and 80% or less by mass, and the AlN content is 20% or more and 50% or less by mass. The thermal conductivity of the ceramic sintered body is higher than or equal to 25 W/(m·K) and lower than or equal to 50 W/(m·K). The linear thermal expansion coefficient of the ceramic sintered body is higher than or equal to 6.5 ppm/K and lower than or equal to 7.5 ppm/K and different by 0.3 ppm/K or less from the linear thermal expansion coefficient of the composite sintered body, which configures the heating-part body 21.

In the third example, the ceramic sintered body contains AlON as a constituent phase. For example, AlON is $Al_5O_6N$ or $Al_9O_3N_7$. The ceramic sintered body in the third example may contain two kinds or more of AlON. The AlON content in the ceramic sintered body in the third example is, for example, 70% or more and 90% or less by mass. The thermal conductivity of the ceramic sintered body is higher than or equal to 20 W/(m·K) and lower than or equal to 45 W/(m·K). The linear thermal expansion coefficient of the ceramic sintered body is higher than or equal to 7.0 ppm/K and lower than or equal to 7.7 ppm/K and different by 0.3 ppm/K or less from the linear thermal expansion coefficient of the composite sintered body, which configures the heating-part body 21.

In the fourth example, the ceramic sintered body contains AlON and SiALON as constituent phases. For example, SiAlON is $Si_2Al_4O_4N_4$ or $Si_6Al_6O_9N_8$. The ceramic sintered body in the fourth example may contain two or more kinds of AlON and/or two or more kinds of SiAlON. The total content of AlON and SiAlON in the ceramic sintered body in the fourth example is, for example, 95% or more and 99.5% or less by mass. The AlON content in the ceramic sintered body is 80% or more and 95% or less by mass, and the SiAlON content is 5% or more and 20% or less by mass. The thermal conductivity of the ceramic sintered body is higher than or equal to 10 W/(m·K) and lower than or equal to 20 W/(m·K). The linear thermal expansion coefficient of the ceramic sintered body is higher than or equal to 6.5 ppm/K and lower than or equal to 7.2 ppm/K and different by 0.3 ppm/K or less from the linear thermal expansion coefficient of the composite sintered body, which configures the heating-part body 21.

Next is a description of the method of manufacturing the ceramic sintered body, which configures the supporter body 31 serving as the aforementioned second structure. In the manufacture of the ceramic sintered body, first, mixed powder is prepared by mixing raw powder. Then, the mixed powder is molded into a green body. Then, the green body is fired so as to produce the aforementioned ceramic sintered body.

The preparation of the mixed powder, the molding of the green body, and the firing of the green body are conducted by approximately the same methods as those used in the manufacture of the composite sintered body, which configures the heating-part body 21. For example, the ceramic sintered body is produced by subjecting the mixed powder to uniaxial pressure molding and then to hot press firing. Alternatively, the ceramic sintered body may be produced by subjecting the mixed powder to uniaxial pressure molding and then to cold isostatical press (CIP) so as to form the green body and then subjecting the green body to atmospheric firing in a nitrogen ($N_2$) gas flow environment.

The bonding of the first structure and the second structure is implemented by, for example, liquid-solid bonding described in Japanese Patent No. 3604888, which is incorporated herein by this reference. In this case, the first structure and the second structure may be bonded by heating after the application of a bonding agent that contains AlN ceramic and a fusing agent between the first structure and the second structure.

Next is a description of Examples 1 to 7 of the stacked structure 10 according to the present embodiment (i.e., the structure obtained by stacking and bonding the heating-part body 21 serving as the first structure and the supporter body 31 serving as the second structure) and stacked structures according to Comparative Examples 1 to 7 for comparison with the stacked structure 10, with reference to Table 1. Examples 1 to 7 and Comparative Examples 1 to 7 used the same first structure (i.e., heating-part body 21) and changed the constituent phases of the second structure (i.e., supporter body 31) that is bonded to the first structure. Then, a thermal test was conducted on each stacked structure 10, and the presence or absence of cracks at the junction between the first structure and the second structure was observed by visual inspection with naked eyes or with a microscope. In the thermal test, the temperature rise and drop of the stacked structure 10 from ambient temperature up to 800° C. were repeated five times in a nitrogen atmosphere or in the atmosphere, and the stacked structure 10 was held at 800° C. for 500 hours. Thereafter, the temperature of the stacked structure 10 was returned to ambient temperature, and the aforementioned observation was conducted.

TABLE 1

| | Second Structure | | | |
|---|---|---|---|---|
| | Constituent Phase(s) | Linear Thermal Expression Coefficient (ppm/K) | Thermal Conductivity (W/(m · K)) | Cracks at Junction |
| Comparative Example 1 | AlN, $Al_5Y_3O_{12}$ | 6.5 | 50 | Yes |
| Comparative Example 2 | $Al_5O_6N$, $Al_2O_3$ | 7.6 | 15 | Yes |
| Example 1 | AlN, $MgAl_2O_4$, ZrN | 6.8 | 40 | No |
| Example 2 | AlN, $Al_5Y_3O_{12}$ | 7.4 | 26 | No |
| Example 3 | AlN, $Al_5Y_3O_{12}$ | 7.1 | 34 | No |
| Example 4 | $Al_5O_6N$, AlN, ZrN | 7.1 | 20 | No |
| Example 5 | $Si_2AlO_4N_4$, $Al_5O_6N$ | 7.1 | 11 | No |
| Example 6 | AlN, $MgAl_2O_4$, ZrN | 7.1 | 38 | No |
| Example 7 | AlN, $MgAl_2O_4$ | 7.0 | 36 | No |
| Comparative Example 3 | $Al_2O_3$ | 8.0 | 40 | Yes |
| Comparative Example 4 | $MgAl_2O_4$ | 8.0 | 25 | Yes |
| Comparative Example 5 | $Al_5O_6N$, AlN | 7.5 | 13 | Yes |
| Comparative Example 6 | AlN | 5.5 | 80 | Yes |
| Comparative Example 7 | $Si_2Al_4O_4N_4$, $Si_6Al_6O_9N_8$, $Al_2O_3$, $Al_6O_{13}Si_2$ | 3.1 | 15 | Yes |

The first structure was produced by the aforementioned method of manufacturing the composite sintered body. First, AlN powder, $MgAl_2O_4$ powder, and zirconium dioxide ($ZrO_2$) powder were prepared as raw powder. Then, mixed powder obtained by mixing the raw powder was subjected to hot press firing so as to obtain the first structure.

The AlN powder used as the raw material was commercially available AlN powder with a mean particle diameter of 1.3 μm and an oxygen content of 0.8% by mass. The $MgAl_2O_4$ powder used as the raw material was produced by a method described later. The $ZrO_2$ powder used as the raw material was commercially available $ZrO_2$ powder with a specific surface area of 15 m²/g and a purity greater than or equal to 99.9%. The raw material was composed of 54.5% by mass of AlN, 44.5% by mass of $MgAl_2O_4$, and 1.0% by mass of $ZrO_2$.

The aforementioned $MgAl_2O_4$ powder was produced using commercially available MgO powder with a mean particle diameter of 1.2 μm and a purity greater than or equal to 99.9% and commercially available $Al_2O_3$ powder with a mean particle diameter of 0.2 μm and a purity greater than or equal to 99.9%. First, the MgO powder and the $Al_2O_3$ powder were weighed in the equal amount of substance (i.e., equal molar quantity) and subjected to wet mixing in a ball mill for four hours. The solvent used in the wet mixing was isopropyl alcohol (IPA). The ball in the ball mill was made of $ZrO_2$. Then, slurry obtained by the wet mixing was dried in an $N_2$ atmosphere and sized through a 100-mesh sieve.

Then, the sized powder was subjected to heat treatment at 1300° C. in the atmosphere to produce $MgAl_2O_4$ synthesized powder, and the synthesized powder was subjected to wet grinding in a ball mill for six hours. The solvent used in the wet grinding was IPA. The ball in the ball mill was made of $ZrO_2$. Then, slurry obtained by the wet grinding was dried in an $N_2$ atmosphere and sized through a 100-mesh sieve so as to obtain $MgAl_2O_4$ powder serving as the raw material. The $MgAl_2O_4$ powder has a mean particle diameter of 0.2 μm. Instead of this $MgAl_2O_4$ powder, commercially available $MgAl_2O_4$ powder (e.g., $MgAl_2O_4$ powder with a mean particle diameter of 0.2 μm, a specific surface area of 26 $m^2/g$, and a purity greater than or equal to 99%) may be used in the production of the first structure.

In the aforementioned mixture of the raw powder, wet mixing was conducted in a ball mill for 20 hours. The solvent used in the wet mixing was IPA. The ball in the ball mill was made of $ZrO_2$. Alternatively, an iron-cored nylon ball may be used as the ball. Then, slurry obtained by the wet mixing was dried in an $N_2$ atmosphere and sized through a 100-mesh sieve so as to obtain the aforementioned mixed powder. In the mixed powder, a total of the content of $ZrO_2$, i.e., impurities resulting from the ball made of $ZrO_2$, and the content of $ZrO_2$ used as the raw material was in the range of 1.0% by mass to 2.0% by mass.

In the aforementioned molding of the mixed powder, conducting uniaxial pressure molding was conducted under a pressure of 100 $kgf/cm^2$ to 150 $kgf/cm^2$ to produce a generally disk-like green body, and the green body was housed in a hot press die. There are no particular limitations on the molding pressure, and the molding pressure may be changed to any of various values that enable maintaining the shape. The mixed powder may be charged into the hot press die in the form of a green powder.

The aforementioned firing of the green body involved hot press firing. The press pressure was set to 200 $kgf/cm^2$. A maximum temperature during heating was set to 1720° C., and the holding time at the maximum temperature was set to eight hours. After held at the maximum temperature for eight hours, the green body was cooled down to 1200° C. with a ratio of 300° C./h to complete the firing. In the temperature range from ambient temperature to 1000° C., the firing was conducted in vacuum atmosphere, and after the temperature has reached 1000° C., an $N_2$ gas was introduced by an amount of 1.5 atmospheric pressure (0.152 MPa).

The produced first structure had an open porosity of 0.01%, a volume density of 3.45 $g/cm^3$, thermal conductivity of 39 $W/(m·K)$, a linear thermal expansion coefficient of 7.1 ppm/K, volume resistivity of $1.9 \times 10^{15}$ Ω·cm at ambient temperature, and volume resistivity of $2.4 \times 10^{10}$ Ω·cm at 700° C.

The second structure was produced by the aforementioned method of manufacturing the ceramic sintered body. First, raw powder corresponding to each of the examples and the comparative examples was prepared. Then, mixed powder obtained by mixing the raw powder was subjected to uniaxial pressure molding and then to hot press firing, or was subjected to uniaxial pressure molding and cold isostatical press and then to atmospheric firing, so as to obtain the second structure. The pressure during the cold isostatical press was 1.5 $ton/cm^2$. A maximum heating temperature during firing was appropriately adjusted within a range of 1600° C. to 1850° C. so that the second structure had an open porosity less than 0.1%. Among Examples 1 to 7 and Comparative Examples 1 to 7 described below, Comparative Examples 3, 4, and 6 conducted the aforementioned hot press firing. Examples 1 to 7 and Comparative Examples 1, 2, 5, 7 conducted the aforementioned atmospheric firing.

The second structures in Examples 1, 6, and 7 corresponded to the aforementioned first example (i.e., contains AlN and $MgAl_2O_4$). The constituent phases of the second structures in Examples 1 and 6 were AlN, $MgAl_2O_4$, and zirconium nitride (ZrN). The constituent phases of the second structure in Example 7 were AlN and $MgAl_2O_4$. The constituent phases of the second structures were identified through analysis of an X-ray diffraction pattern obtained by measuring the powder of the composite sintered body with an X-ray diffractometer. In this measurement, the composite sintered body serving as the material was pulverized in a mortar, and a crystalline phase was identified using the X-ray diffractometer. The measurement conditions included CuKα, 40 kV, 40 mA, and 2θ=5-70°, and a sealed tube-type X-ray diffractometer (D8 ADVANCE produced by Bruker AXS Inc.) was used. The measurement was conducted with a step size of 0.02°. The same applied to the other examples and the comparative examples.

The raw powder used to produce the second structures in Examples 1, 6, and 7 included AlN powder with a mean particle diameter of 1.3 μm, $MgAl_2O_4$ powder with a mean particle diameter of 0.4 μm, $Al_2O_3$ powder with a mean particle diameter of 0.5 μm, and $ZrO_2$ powder with a specific surface area of 16 $m^2/g$. Every powder was commercially available powder with a purity greater than or equal to 99.9%. The raw material in Example 6 was composed of 45.1% by mass of AlN, 47.9% by mass of $MgAl_2O_4$, 6.1% by mass of $Al_2O_3$, and 0.9% by mass of $ZrO_2$.

The linear thermal expansion coefficient of the second structure in Example 6 was 7.1 ppm/K and the same as the linear thermal expansion coefficient of the first structure. The linear thermal expansion coefficient of the second structure in Example 1 was 6.8 ppm/K and different by 0.3 ppm/K from the linear thermal expansion coefficient of the first structure. The linear thermal expansion coefficient of the second structure in Example 7 was 7.0 ppm/K. The linear thermal expansion coefficients of the first and second structures were obtained by measuring thermal expansion curves in the temperature range from ambient temperature to 1000° C. in a nitrogen atmosphere with a rate of temperature rise of 10° C./min, using a thermal mechanical analyzer TP2 manufactured by Rigaku Corporation, and then calculating average linear thermal expansion coefficients (CTEs) in the temperature range from ambient temperature to 1000° C. from the result of the measurement. Alumina was used as a reference sample. The same applied to the other examples and the comparative examples. The second structures in Examples 1, 6, and 7 had thermal conductivities of 36 $W/(m·K)$ to 40 $W/(m·K)$. The thermal conductivities were calculated from the following equation: thermal conductivity=specific heat×thermal diffusivity×volume density, where the specific heat was measured by differential scanning calorimetry (DSC) and the thermal diffusivity was measured by laser flashing. The same applied to the other examples and the comparative examples. In Examples 1, 6, and 7, no cracks were generated at the junction between the first structure and the second structure.

On the other hand, the constituent phase of the second structure in Comparative Example 6 was only AlN. The constituent phase of the second structure in Comparative Example 4 was only $MgAl_2O_4$. The constituent phase of the second structure in Comparative Example 3 was only $Al_2O_3$. The second structures in Comparative Examples 3, 4, and 6 were produced by hot press firing using the same raw powder as that used to produce the second structures in Examples 1, 6, and 7 described above.

The linear thermal expansion coefficient of the second structure in Comparative Example 3 was 8.0 ppm/K and different by 0.9 ppm/K from the linear thermal expansion coefficient of the first structure. The thermal conductivity of the second structure in Comparative Example 3 was 40 W/(m·K). In Comparative Example 3, cracks were generated at the junction between the first structure and the second structure.

The linear thermal expansion coefficient of the second structure in Comparative Example 4 was 8.0 ppm/K and different by 0.9 ppm/K from the linear thermal expansion coefficient of the first structure. The thermal conductivity of the second structure in Comparative Example 4 was 25 W/(m·K). In Comparative Example 4, cracks were generated at the junction between the first structure and the second structure.

The linear thermal expansion coefficient of the second structure in Comparative Example 6 was 5.5 ppm/K and different by 1.6 ppm/K from the linear thermal expansion coefficient of the first structure. The thermal conductivity of the second structure in Comparative Example 6 was 80 W/(m·K). In Comparative Example 6, cracks were generated at the junction between the first structure and the second structure.

The second structures in Examples 2 and 3 and Comparative Example 1 corresponded to the aforementioned second example (i.e., contain AlN and $Al_5Y_3O_{12}$). The constituent phases of the second structures in Examples 2 and 3 were AlN and $Al_5Y_3O_{12}$. The constituent phases of the second structure in Comparative Example 1 were also AlN and $Al_5Y_3O_{12}$.

The raw powder used to produce the second structures in Examples 2 and 3 and Comparative Example 1 included AlN powder with a mean particle diameter of 1.3 μm, $Y_2O_3$ powder with a mean particle diameter of 1.0 μm, and $Al_2O_3$ powder with a mean particle diameter of 0.5 μm. Every powder was commercially available powder with a purity greater than or equal to 99.9%. The raw material in Example 3 was composed of 57.2% by mass of AlN, 24.4% by mass of $Y_2O_3$, and 18.4% by mass of $Al_2O_3$.

The linear thermal expansion coefficient of the second structure in Example 3 was 7.1 ppm/K and the same as the linear thermal expansion coefficient of the first structure. The linear thermal expansion coefficient of the second structure in Example 2 was 7.4 ppm/K and different by 0.3 ppm/K from the linear thermal expansion coefficient of the first structure. The thermal conductivity of the second structure in Example 2 was 26 W/(m·K) and different by 13 W/(m·K) from the thermal conductivity of the first structure (39 W/(m·K)). The thermal conductivity of the second structure in Example 3 was 34 W/(m·K). In Examples 2 and 3, no cracks were generated at the junction between the first structure and the second structure.

On the other hand, the linear thermal expansion coefficient of the second structure in Comparative Example 1 was 6.5 ppm/K and different by 0.6 ppm/K from the linear thermal expansion coefficient of the first structure. The thermal conductivity of the second structure in Comparative Example 1 was 50 W/(m·K). In Comparative Example 1, cracks were generated at the junction between the first structure and the second structure.

The second structures in Example 4 and Comparative Examples 2 and 5 corresponded to the aforementioned third example (i.e., contain AlON). The constituent phases of the second structure in Example 4 were AlN, $Al_5O_6N$, and ZrN.

The constituent phases of the second structure in Comparative Example 2 were $Al_5O_6N$ and $Al_2O_3$. The constituent phases of the second structure in Comparative Example 5 were AlN and $Al_5O_6N$.

The raw powder used to produce the second structures in Example 4 and Comparative Examples 2 and 5 included AlN powder with a mean particle diameter of 1.3 μm, $Al_2O_3$ powder with a mean particle diameter of 0.5 μm, and $ZrO_2$ powder with a specific surface area of 16 m²/g. Every powder was commercially available powder with a purity greater than or equal to 99.9%. The raw material in Example 4 was composed of 9.5% by mass of AlN, 89.5% by mass of $Al_2O_3$, and 1.0% by mass of $ZrO_2$.

The linear thermal expansion coefficient of the second structure in Example 4 was 7.1 ppm/K and the same as the linear thermal expansion coefficient of the first structure. The thermal conductivity of the second structure in Example 4 was 20 W/(m·K) and different by 19 W/(m·K) from the thermal conductivity of the first structure (39 W/(m·K)). In Example 4, no cracks were generated at the junction between the first structure and the second structure.

On the other hand, the linear thermal expansion coefficient of the second structure in Comparative Example 2 was 7.6 ppm/K and different by 0.5 ppm/K from the linear thermal expansion coefficient of the first structure. The linear thermal expansion coefficient of the second structure in Comparative Example 5 was 7.5 ppm/K and different by 0.4 ppm/K from the linear thermal expansion coefficient of the first structure. The thermal conductivities of the second structures in Comparative Examples 2 and 5 were in the range of 13 W/(m·K) to 15 W/(m·K). In Comparative Examples 2 and 5, cracks were generated at the junction between the first structure and the second structure.

The second structure in Example 5 corresponded to the aforementioned fourth example (i.e., contains AlON and SiAlON). The constituent phases of the second structure in Example 5 were $Al_{506}N$ and $Si_2Al_4O_4N_4$. The raw powder used to produce the second structure in Example 5 included AlN powder with a mean particle diameter of 1.3 μm, $Al_2O_3$ powder with a mean particle diameter of 0.5 μm, $Si_3N_4$ powder with a mean particle diameter of 0.7 μm and a gelatinization ratio of 95% or more by mass, and silicon dioxide ($SiO_2$) powder with a mean particle diameter of 0.3 μm. Every powder was commercially available powder with a purity greater than or equal to 99.9%. The raw material in Example 5 was composed of 10.2% by mass of AlN, 83.7% by mass of $Al_2O_3$, and 6.0% by mass of $Si_3N_4$.

The linear thermal expansion coefficient of the second structure in Example 5 was 7.1 ppm/K and the same as the linear thermal expansion coefficient of the first structure. The thermal conductivity of the second structure in Example 5 was 11 W/(m·K) and different by 28 W/(m·K) from the thermal conductivity of the first structure (39 W/(m·K)). In Example 5, no cracks were generated at the junction between the first structure and the second structure.

On the other hand, the constituent phases of the second structure in Comparative Example 7 were $Si_2Al_4O_4N_4$, $Si_6Al_6O_9N_8$, $Al_2O_3$, and $Al_6O_{13}Si_2$, and the main phase was $Si_2Al_4O_4N_4$. The second structure in Comparative Example 7 was produced using the same raw powder as that used to produce the second structure in Example 5 described above. The linear thermal expansion coefficient of the second structure in Comparative Example 7 was 3.1 ppm/K and different by 4.0 ppm/K from the linear thermal expansion coefficient of the first structure. The thermal conductivity of the second structure in Comparative Example 7 was 15

W/(m·K). In Comparative Example 7, cracks were generated at the junction between the first structure and the second structure.

As described above, the stacked structure 10 includes the first structure (in the aforementioned example, the heating-part body 21) formed of the composite sintered body that contains AlN and $MgAl_2O_4$ as main phases, and the second structure (in the aforementioned example, the supporter body 31) formed of the ceramic sintered body and stacked on and bonded to the first structure. The difference in linear thermal expansion coefficient between the first structure and the second structure is less than or equal to 0.3 ppm/K. By reducing the difference in linear thermal expansion coefficient between the first structure and the second structure in this way, even if the stacked structure 10 is used in an environment in which heating and cooling are repeated, it is possible to reduce the occurrence of thermal stress at the junction between the first structure and the second structure resulting from the difference in the amounts of thermal expansion and shrinkage between the first structure and the second structure. As a result, it is possible to lessen damage to the junction between the first structure and the second structure resulting from the thermal stress as shown in Examples 1 to 7.

As described above, the $MgAl_2O_4$ content in the composite sintered body of the first structure is preferably 15% or more and 70% or less by mass. This enables providing the stacked structure 10 that includes a high-density first structure with high plasma corrosion resistance, high volume resistivity, and high thermal conductivity.

As described above, the volume resistivity of the composite sintered body of the first structure at 700° C. is preferably higher than or equal to $7.0 \times 10^7$ Ω·cm. This prevents or suppresses current leakage via the first structure (e.g., current leakage between the resistance heating element 22 and the internal electrode 23). As a result, it is possible to suppress disturbances in control resulting from leakage current during processing such as processing for heating the substrate 9 with the resistance heating element 22 or plasma treatment of the substrate 9 using the internal electrode 23.

As described above, the thermal conductivity of the composite sintered body of the first structure at ambient temperature is preferably higher than or equal to 15 W/(m·K). This enables heating the substrate 9 via the first structure with improved efficiency and minimized temperature variations in each portion (i.e., with improved thermal uniformity).

For example, in the case of a desire to improve the thermal uniformity of the substrate 9, the thermal conductivity of the ceramic sintered body of the second structure at ambient temperature is preferably lower by 10 W/(m·K) or more than the thermal conductivity of the composite sintered body of the first structure at ambient temperature as described above (Examples 2, 4, and 5). In this way, by making the thermal conductivity of the second structure lower than the thermal conductivity of the first structure and increasing the difference in thermal conductivity between the first structure and the second structure, it is possible to suppress the escape of heat from the first structure via the second structure to the outside of the stacked structure 10 and to improve the thermal uniformity (i.e., temperature uniformity) of the first structure during heating of the first structure. As a result, the thermal uniformity of the substrate 9 can be improved during heating of the substrate 9.

In the above-described stacked structure 10, it is preferable that the ceramic sintered body of the second structure contains AlON. This enables making the thermal conductivity of the second structure lower than the thermal conductivity of the first structure and increasing the difference in thermal conductivity between the first structure and the second structure as shown in Examples 4 and 5. As a result, the thermal uniformity of the first structure can be improved.

In the above-described stacked structure 10, it is preferable that the ceramic sintered body of the second structure further contains SiAlON. This enables making the thermal conductivity of the second structure lower than the thermal conductivity of the first structure and further increasing the difference in thermal conductivity between the first structure and the second structure as shown in Example 5. As a result, the thermal uniformity of the first structure can be further improved.

As described above, the stacked structure 10 can lessen damage to the junction between the first structure and the second structure resulting from thermal stress. In the semiconductor manufacturing apparatus, since heating and cooling are often repeated during the processing of the substrate 9, the stacked structure 10 is suited for use as a semiconductor manufacturing member used in the semiconductor manufacturing apparatus. In particular, the stacked structure 10 is suited for use as a semiconductor manufacturing apparatus member used in a high-power semiconductor manufacturing apparatus such as a high-power etching device with high processing temperature during heating. One preferable example of the semiconductor manufacturing apparatus member produced using the stacked structure 10 is the aforementioned heater 1 used to heat the substrate 9. As described above, the heater 1 includes the substrate heating part 2 that supports and heats the substrate 9, and the supporter 3 that is bonded to the substrate heating part 2 to support the substrate heating part 2. The substrate heating part 2 includes the first structure (i.e., the heating-part body 21) of the stacked structure 10, and the supporter 3 includes the second structure (i.e., the supporter body 31) of the stacked structure 10.

The stacked structure 10 described above may be modified in various ways.

For example, the thermal conductivity of the ceramic sintered body of the second structure may be higher than or equal to the thermal conductivity of the composite sintered body of the first structure as in Example 1. The difference in thermal conductivity between these structures may be less than 10 W/(m·K) as in Examples 1, 3, 6, and 7.

For example, in the case of a desire to improve heat extraction properties of the substrate 9, the thermal conductivity of the ceramic sintered body of the second structure at ambient temperature is preferably higher than the thermal conductivity of the composite sintered body of the first structure at ambient temperature, or the difference in thermal conductivity therebetween is preferably small, as in Examples 1, 3, 6, and 7. This facilitates the escape of heat from the first structure via the second structure to the outside of the stacked structure 10 during heating of the first structure, and accordingly improves the heat extraction properties of the first structure. As a result, it is possible to improve the heat extraction properties of the substrate 9 during temperature control of the substrate 9.

The $MgAl_2O_4$ content in the composite sintered body of the first structure may be less than 15% by mass, and may be higher than 70% by mass. The composite sintered body may contain substances other than AlN and $MgAl_2O_4$ as constituent phases. The thermal conductivity of the composite sintered body may be less than 15 W/(m·K). The volume resistivity of the composite sintered body may be less than $7.0 \times 10^7$ Ω·cm.

The constituent phases of the ceramic sintered body of the second structure are not limited to the examples described above, and may be modified in various ways within the range that enables making the difference in linear thermal expansion coefficient between the first structure and the second structure less than or equal to 0.3 ppm/K.

The shapes of the substrate heating part 2 and the supporter 3 in the heater 1 may be modified in various ways. For example, the supporter 3 does not necessarily have to be a shaft having a smaller diameter than the diameter of the substrate heating part 2, and may be a generally disk-like base having a diameter greater than or equal to the diameter of the substrate heating part 2.

The stacked structure 10 described above may be used as any of various semiconductor manufacturing apparatus members other than the heater 1. For example, the stacked structure 10 may be used as a susceptor that includes no resistance heating elements. Alternatively, the stacked structure 10 may be used in applications other than the semiconductor manufacturing apparatus members. For example, the stacked structure 10 may be used in a ceramic heater that heats substrates other than semiconductor substrates or target objects other than substrates.

The configurations of the preferred embodiments and variations described above may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

INDUSTRIAL APPLICABILITY

The present invention is applicable in fields relating to semiconductor manufacturing apparatuses, and for example applicable as a heater that supports and heats semiconductor substrates.

REFERENCE SIGNS LIST

1 Heater
2 Substrate heating part
3 Supporter
9 Substrate
10 Stacked structure
21 Heating-part body
31 Supporter body

The invention claimed is:

1. A stacked structure, comprising:
a first structure formed of a composite sintered body that contains AlN and $MgAl_2O_4$ as main phases containing 15% or more and 70% or less by mass of $MgAl_2O_4$ and 30% or more and 85% or less by mass of AlN, wherein the main phases comprise from greater than or equal to 95 wt. % to less than or equal to 100 wt. % of the composite sintered body, and
a second structure formed of a ceramic sintered body and stacked on and bonded to said first structure, wherein the ceramic sintered body comprises a) 95 mass % or more of AlN and aluminum yttrium oxide ($Al_5Y_3O_{12}$) as constituent phases and contains from 50 mass % to 80 mass % of $Al_5Y_3O_{12}$ and from 20 mass % to 50 mass % of AlN, b) 70 mass % or more and 90 mass % or less of AlON as a constituent phase, or c) 95 mass % or more of AlON and SiAlON as constituent phases and contains from 80 mass % to 95 mass % of AlON and from 5 mass % to 20 mass % of SiAlON,
wherein a difference in linear thermal expansion coefficient between said first structure and said second structure is less than or equal to 0.3 ppm/K.

2. The stacked structure according to claim 1, wherein said composite sintered body of said first structure contains 25% or more and 60% or less by mass of $MgAl_2O_4$ and 45% or more and 75% or less by mass of AlN.

3. The stacked structure according to claim 1, wherein said composite sintered body of said first structure has volume resistivity higher than or equal to $7.0\times10^7$ Ω·cm at 700° C.

4. The stacked structure according to claim 1, wherein said composite sintered body of said first structure has thermal conductivity higher than or equal to 15 W/(m·K) at ambient temperature.

5. The stacked structure according to claim 1, wherein thermal conductivity of said ceramic sintered body of said second structure at ambient temperature is lower by 10 W/(m·K) or more than thermal conductivity of said composite sintered body of said first structure at ambient temperature.

6. A semiconductor manufacturing apparatus member used in a semiconductor manufacturing apparatus, comprising:
the stacked structure according to claim 1.

7. The semiconductor manufacturing apparatus member according to claim 6, comprising:
a substrate heating part that includes said first structure of said stacked structure and supports and heats a substrate; and
a supporter that includes said second structure of said stacked structure and is bonded to said substrate heating part to support said substrate heating part.

* * * * *